US006661042B2

(12) United States Patent
Hsu

(10) Patent No.: US 6,661,042 B2
(45) Date of Patent: Dec. 9, 2003

(54) ONE-TRANSISTOR FLOATING-BODY DRAM CELL IN BULK CMOS PROCESS WITH ELECTRICALLY ISOLATED CHARGE STORAGE REGION

(75) Inventor: Fu-Chieh Hsu, Saratoga, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/095,901

(22) Filed: Mar. 11, 2002

(65) Prior Publication Data

US 2003/0168677 A1 Sep. 11, 2003

(51) Int. Cl.[7] .......................................... H01L 29/768
(52) U.S. Cl. ................................ 257/239; 257/296
(58) Field of Search ............................... 257/239, 296

(56) References Cited

U.S. PATENT DOCUMENTS

| | | | | |
|---|---|---|---|---|
| 5,216,269 A | * | 6/1993 | Middelhoek et al. ...... | 257/318 |
| 5,264,716 A | * | 11/1993 | Kenney .................. | 257/301 |
| 5,672,536 A | * | 9/1997 | Wu et al. ............... | 438/237 |
| 5,708,290 A | * | 1/1998 | Cacciola et al. .......... | 257/500 |
| 5,739,567 A | | 4/1998 | Wong .................... | 257/316 |
| 5,789,286 A | * | 8/1998 | Subbanna ................ | 438/221 |
| 5,937,296 A | | 8/1999 | Arnold .................. | 438/270 |
| 6,281,557 B1 | | 8/2001 | Trueby et al. ........... | 257/390 |

OTHER PUBLICATIONS

Article entitled "A Capacitor–Less 1T–DRAM Cell", IEEE Electron Device Letters, vol. 23, No. 2, Feb. 2002, by S. Okhonin et al., pp. 85–87.
Article entitled "Memory Design Using One–Transistor Gain Cell on SOI" ISSCC 2002/Session 9/DRAM And Ferroelectric Memories/9.1; by Takashi Ohsawa et al.; pp. 452–454.

* cited by examiner

*Primary Examiner*—Allan R. Wilson
(74) *Attorney, Agent, or Firm*—Bever, Hoffman & Harms, LLP; E. Eric Hoffman

(57) ABSTRACT

A one-transistor, floating-body (1T/FB) dynamic random access memory (DRAM) cell is provided that includes a field-effect transistor fabricated using a process compatible with a standard CMOS process. The field-effect transistor includes a source region and a drain region of a first conductivity type and a floating body region of a second conductivity type, opposite the first conductivity type, located between the source region and the drain region. A buried region of the first conductivity type is located under the source region, drain region and floating body region. The buried region helps to form a depletion region, which is located between the buried region and the source region, the drain region and the floating body region. The floating body region is thereby isolated by the depletion region. A bias voltage can be applied to the buried region, thereby controlling leakage currents in the 1T/FB DRAM cell.

15 Claims, 9 Drawing Sheets

ONE-TRANSISTOR FLOATING-BODY DRAM CELL IN BULK CMOS PROCESS WITH ELECTRICALLY ISOLATED CHARGE STORAGE REGION

RELATED APPLICATIONS

The present invention is related to commonly owned, co-filed U.S. patent application Ser. No. 10/095,984, entitled "VERTICAL ONE-TRANSISTOR FLOATING-BODY DRAM CELL IN BULK CMOS PROCESS WITH ELECTRICALLY ISOLATED CHARGE STORAGE REGION" by Fu-Chieh Hsu.

BACKGROUND OF THE INVENTION

1. Field of the Invention

The present invention relates to a dynamic random access memory (DRAM) cell, as well as methods for operating and fabricating a DRAM cell. More specifically, the present invention relates to a one-transistor floating-body DRAM cell formed using a process compatible with a bulk CMOS process, wherein charge is stored inside an electrically isolated body region underneath the transistor channel region.

2. Related Art

Conventional one-transistor, one-capacitor (1T/1C) DRAM cells require a complex process for fabrication. Moreover, significant area is required to form the capacitor needed for storage of signal charge. Recently, one-transistor, floating-body (1T/FB) DRAM cells using partially-depleted silicon-on-insulator (PD-SOI) processes have been proposed, in which a signal charge is stored inside a floating body region, which modulates the threshold voltage ($V_T$) of the transistor. As a result, the separate capacitor of a 1T/FB DRAM cell can be eliminated, thereby resulting in reduced cell area and higher density. Periodic refresh operations are still required for these 1T/FB DRAM cells to counteract the loss of stored charge through junction leakage, gate tunneling leakage and access-induced hot-carrier injections (HCI).

FIG. 1 is a cross-sectional view of a conventional 1T/FB DRAM cell 100 fabricated using a PD-SOI process. DRAM cell 100 includes silicon substrate 101, buried oxide layer 102, oxide regions 103–104, N++ type source and drain regions 105–106, N+ type source and drain regions 107–108, P type floating body region 109, gate oxide 110, gate electrode 111 and sidewall spacers 112–113. Floating body 109 is isolated by gate oxide 110, buried oxide layer 102 and the source and drain depletion regions 107' and 108'. The partially-depleted floating body 109 is used for storing signal charges that modulate the threshold voltage ($V_T$) of DRAM transistor 100 differently when storing different amount of charge. The source node 105 is typically grounded.

A logic "1" data bit is written into DRAM cell 100 by biasing drain node 106 at a high voltage and gate node 111 at a mid-level voltage to induce hot-carrier injection (HCI), whereby hot-holes are injected into floating body node 109, thereby raising the voltage level of floating body node 109, and lowering the threshold voltage ($V_T$) of cell 100. Conversely, a logic "0" data bit is written into DRAM cell 100 by biasing drain node 106 to a negative voltage while gate node 111 is biased at a mid-level voltage, thereby forward biasing the floating body-to-drain junction and removing holes from floating body 109, thereby raising the threshold voltage ($V_T$) of cell 100.

A read operation is performed by applying mid-level voltages to both drain node 106 and gate node 111 (while source node 105 remains grounded). Under these conditions, a relatively large drain-to-source current will flow if DRAM cell 100 stores a logic "1" data bit, and a relatively small drain-to source current will flow if DRAM cell 100 stores a logic "0" data bit. The level of the drain-to-source current is compared with the current through a reference cell to determine the difference between a logic "0" and a logic "1" data bit. Non-selected DRAM cells in the same array as DRAM cell 100 have their gate nodes biased to a negative voltage to minimize leakage currents and disturbances from read and write operations.

One significant disadvantage of conventional 1T/FB DRAM cell 100 is that it requires the use of partially depleted silicon-on-insulator (PD-SOI) process, which is relatively expensive and not widely available. In addition, the floating body effect of the SOI process, although utilized in the 1T/FB DRAM cell advantageously, complicates circuit and logic designs significantly and often requires costly substrate connections to eliminate undesired floating body nodes not located in the 1T/FB DRAM cells. Further, with a PD-SOI process, the device leakage characteristics can be difficult to control due to the lack of effective back-gate control of the bottom interface of the silicon layer that includes silicon regions 107–109.

Conventional 1T/FB DRAM cells are described in more detail in "A Capacitor-less 1T-DRAM Cell," S. Okhonin et al, pp.85–87, IEEE Electron Device Letters, Vol. 23, No.2, February 2002, and "Memory Design Using One-Transistor Gain Cell on SOI," T. Ohsawa et al, pp.152–153, Tech. Digest, 2002 IEEE International Solid-State Circuits Conference, February 2002.

Therefore, one object of the present invention is to provide a 1T/FB DRAM cell that is compatible with a conventional bulk CMOS process, and is compatible with conventional logic processes and conventional logic designs.

It is another object of the present invention to provide an electrical isolation junction that can be biased advantageously to minimize sidewall junction leakage and vertical parasitic bipolar leakage currents.

SUMMARY OF THE INVENTION

Accordingly, the present invention provides a one-transistor, floating-body (1T/FB) dynamic random access memory (DRAM) cell that includes a field-effect transistor fabricated in a semiconductor substrate using a process compatible with a conventional bulk CMOS process. The field-effect transistor includes a source region and a drain region of a first conductivity type and a floating body region of a second conductivity type, opposite the first conductivity type, located between the source region and the drain region.

In accordance with the present invention, a buried region of the first conductivity type is located under the source region, drain region and floating body region. The buried region helps to form a depletion region, which is located between the buried region and the source region, the drain region and the floating body region. The floating body region is thereby isolated by the depletion region.

A bias voltage can be applied to the buried region, thereby limiting leakage currents in the 1T/FB DRAM cell. An adjacent well region having the first conductivity type can be used to contact the buried region, thereby enabling the bias voltage to be applied to the buried region via the well region. Alternately, the buried region can be coupled to an underlying deep well region having the first conductivity type, which in turn can be coupled to an adjacent well region of the first conductivity type. In this configuration, a bias voltage can be applied to the buried region via the well region and the deep well region.

If the field-effect transistor is an NMOS transistor (i.e., the first conductivity type is N-type), then the bias voltage can be selected to have a nominal voltage between −0.5V to and a $V_{CC}$ supply voltage. Conversely, if the field-effect transistor is a PMOS transistor (i.e., the first conductivity type is p-type), then the bias voltage can be selected to have a nominal voltage between 0 Volts and a $V_{CC}$ supply voltage plus 0.5 Volts. In an alternate embodiment, the buried region can be left in a floating state.

If the field-effect transistor is an NMOS transistor, a logic "1" data bit is written to the 1T/FB DRAM cell using a hot carrier injection mechanism, and a logic "0" data bit is written to the 1T/FB DRAM cell using a junction forward bias mechanism.

In a particular embodiment, the 1T/FB DRAM cell of the present invention includes one or more shallow trench isolation (STI) regions, each having a bottom surface. The STI regions are located adjacent to the source and drain regions. The buried region is formed such that a top interface of the buried region is located at or above the bottom surfaces of the STI regions (but below the source and drain regions of the cell). The buried region is also formed such that a bottom interface of the buried region is located below the bottom surfaces of the STI regions.

The present invention also includes a method of fabricating a one-transistor, floating-body (1T/FB) dynamic random access memory (DRAM) cell. This method includes forming a buried region having a first conductivity type below the upper surface of a semiconductor region of a semiconductor substrate, the semiconductor region having a second conductivity type, opposite the first conductivity type. After the buried region has been formed, a field-effect transistor is formed in the semiconductor region over the buried region using conventional CMOS processing steps. The buried region results in the formation of a depletion region between the buried region and source, drain and body regions of the field-effect transistor.

In a particular embodiment, the buried region is formed by an ion implantation step, which is performed through a first mask. A threshold voltage adjustment implant for the field-effect transistor can also be performed through the first mask.

The method can also include forming a well region having the first conductivity type in the semiconductor substrate, wherein the buried region contacts the well region. Alternately, the method can include forming a deep well region having the first conductivity type in the semiconductor substrate, wherein the deep well region is located below and continuous with the buried region.

In accordance with another embodiment, a plurality of the 1T/FB DRAM cells of the present invention can be arranged in an array. An area efficient array layout can be implemented, in which adjacent 1T/FB DRAM cells share a common drain region (and a common drain connection), with the depletion region providing adequate isolation between the two 1T-FB DRAM cells.

The present invention will be more fully understood in view of the following description and drawings.

DETAILED DESCRIPTION

Figure 1:
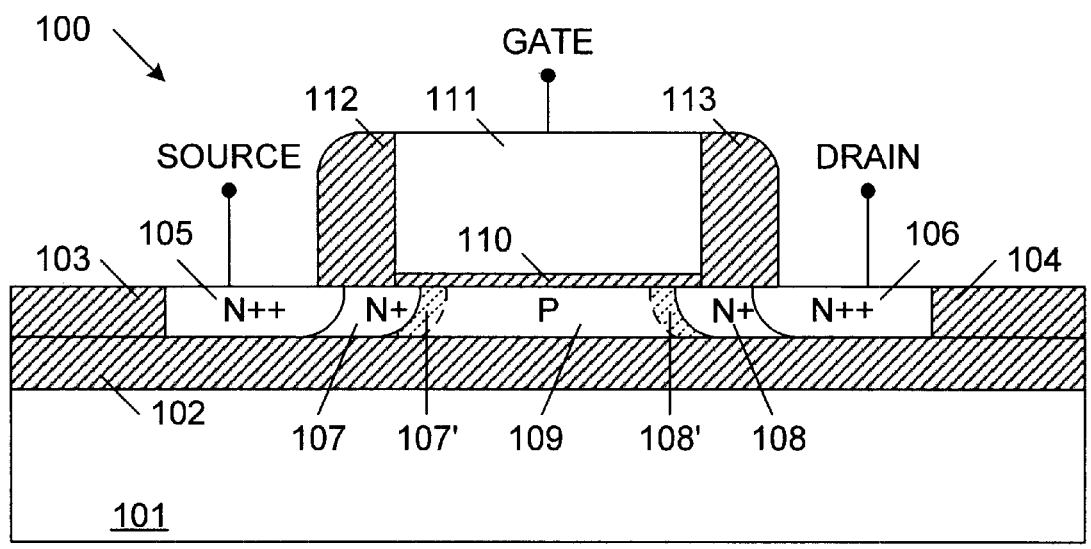
FIG. 1 is a cross-sectional view of a conventional 1T/FB DRAM cell fabricated using a PD-SOI process.
Figure 2:
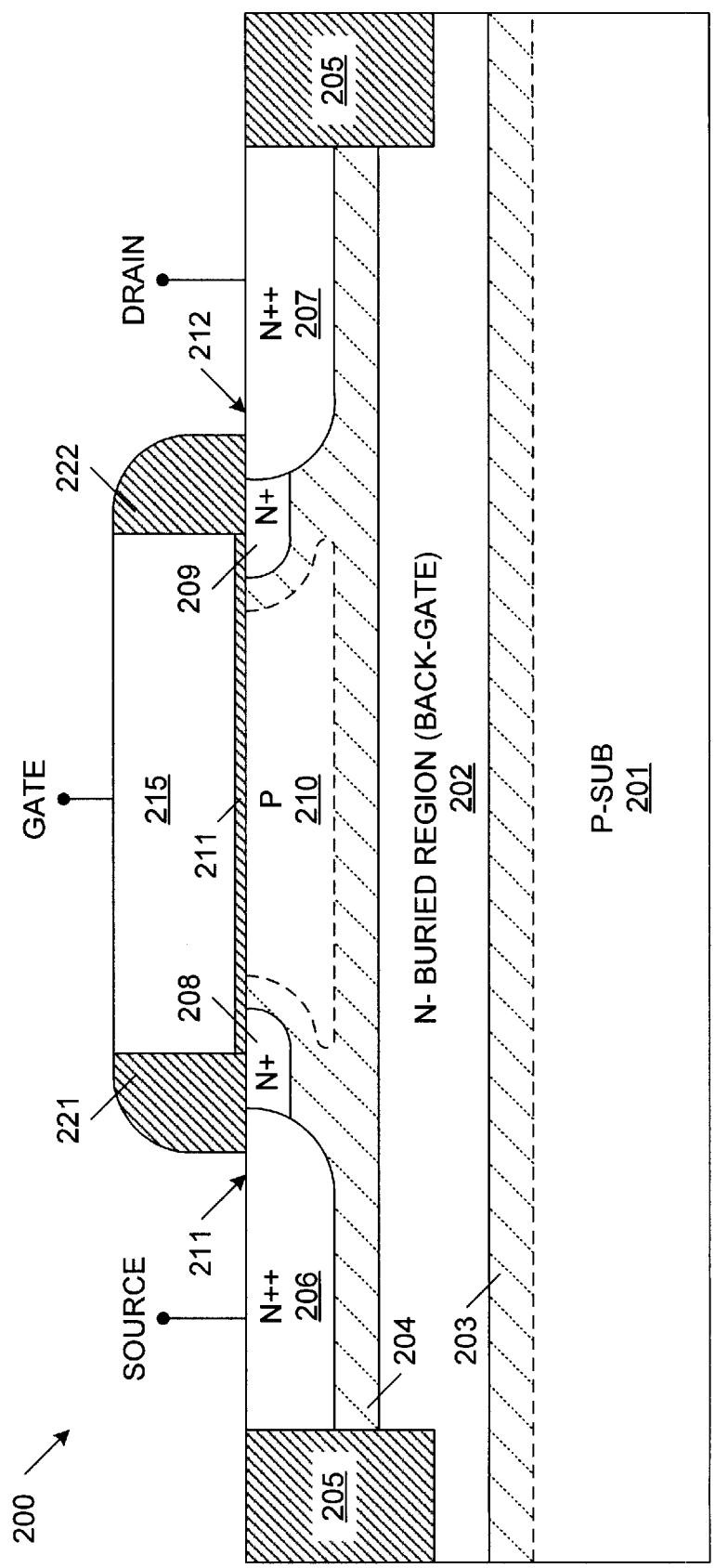
FIG. 2 is a cross-sectional view of a 1T/FB DRAM cell fabricated in a manner compatible with a bulk CMOS process, in accordance with one embodiment of the present invention.

FIG. 2 is a cross-sectional view of an NMOS 1T/FB DRAM cell 200 in accordance with one embodiment of the present invention. Although the present embodiment describes a 1T/FB DRAM cell that uses an NMOS transistor, it is understood that either NMOS or PMOS transistors can be used to form 1T/FB DRAM cells in accordance with the present invention. When a PMOS transistor is used to implement the 1T/FB DRAM cell, the conductivity types of the various elements are reversed.

DRAM cell 200 includes P− type silicon substrate 201, N− type buried region (or back-gate) 202, depletion regions 203–204, shallow trench isolation (STI) regions 205, heavily-doped N++ type source and drain regions 206 and 207, lightly-doped N+ type source and drain regions 208 and 209, P type floating body region 210, gate oxide layer 211, gate electrode 215 and sidewall spacers 221–222.

N++ type source region and N+ type source region combine to form n-type source region 211. Similarly, N++ type drain region and N+ type drain region combine to form n-type drain region 212. N− type buried region 202 is formed below the transistor as a back-gate node. Under proper bias conditions, depletion region 204 completely isolates the floating body region 210 of 1T/FB DRAM cell 200.

Figure 3:
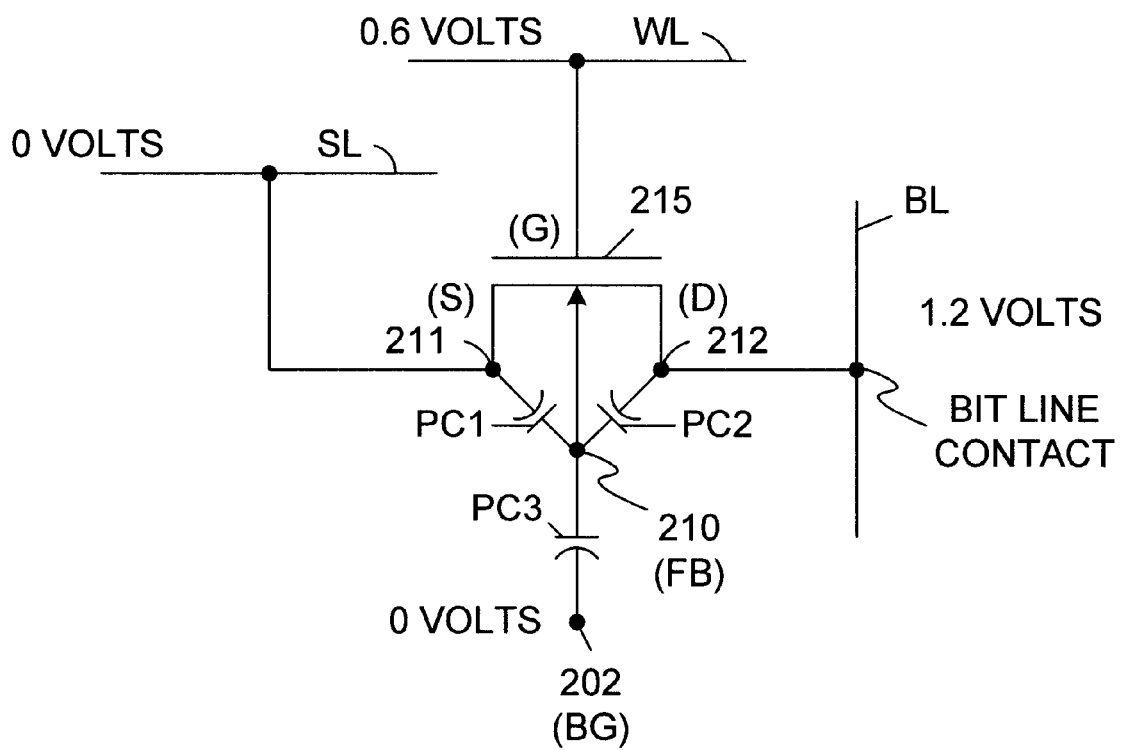
FIG. 3 is a circuit diagram of the 1T/FB DRAM cell of FIG. 2.

FIG. 3 is a circuit diagram of the 1T/FB DRAM cell 200. Gate electrode 215 of DRAM cell 200 is connected to a word line WL, drain 212 is connected to a bit line BL and source 211 is connected to a source line SL. The p-type floating body region 210 underneath the channel region is capacitively coupled to the n-type source region 211 through the parasitic capacitance PC1 of the corresponding PN junction. Similarly, floating body region 210 is capacitively coupled to n-type drain region 212 through the parasitic capacitance PC2 of the corresponding PN junction. Finally, floating body region 210 is capacitively coupled to buried back-gate region 202 through the parasitic capacitance PC3 of the corresponding PN junction.

1T/FB DRAM cell 200 operates as follows. Source region 211 is maintained at a ground voltage level (0 Volts). Buried back-gate region 202 is biased at a voltage around the mid-point of a high drain voltage ($V_{CC}$, or 1.2 Volts) and a low drain voltage (−1.0 Volts) to minimize leakage current from parasitic bipolar actions. In a particular embodiment, buried back-gate region 202 is biased at a ground voltage level (0 Volts). The bias level of buried back-gate region 202 can be adjusted to ensure the junction depletion region 204 beneath source 211 and drain 212 completely isolates floating body region 210, without creating a direct leakage current path from source 211 or drain 212 to back-gate region 202.

A logic "1" data bit is written into DRAM cell 200 by biasing n-type drain region 212 at a logic high voltage of about 1.2 Volts, and gate electrode 215 at a mid-level voltage of about 0.6 Volts, thereby inducing hot-carrier injection (HCI). Under these conditions, hot-holes are injected into p-type floating body region 210, thereby raising the voltage level of floating body region 210, and lowering the threshold voltage ($V_T$) of DRAM cell 200.

Conversely, a logic "0" data bit is written into DRAM cell 200 by biasing n-type drain region 212 to a negative voltage of about −1.0 Volts, while gate electrode 215 is biased at a mid-level voltage of about 0.6 Volts. Under these conditions the PN junction from p-type floating body region 210 to n-type drain region 212 is forward biased, thereby removing holes from floating body region 210. After a logic "0" data bit has been written, DRAM cell 200 exhibits a relatively high threshold voltage ($V_T$)

A read operation is performed by applying a mid-level voltage of about 0.6 Volts to both drain region 212 and gate electrode 215 (while source region 211 and back-gate region 202 remain grounded). Under these conditions, a relatively large drain-to-source current will flow if DRAM cell 200 stores a logic "0" data bit, and a relatively small drain-to source current will flow if DRAM cell 200 stores a logic "1" data bit. The level of the drain-to-source current is compared with the current through a reference cell to determine the difference between a logic "0" and a logic "1" data bit. Non-selected cells in the same array as 1T/FB DRAM cell 200 have their gate electrodes biased to a negative voltage to minimize leakage currents and disturbances from read and write operations.

FIGS. 4A–4D are cross sectional views illustrating the manner in which 1T/FB DRAM cell 200 can be fabricated using a process compatible with a bulk CMOS process.

Figure 4A:
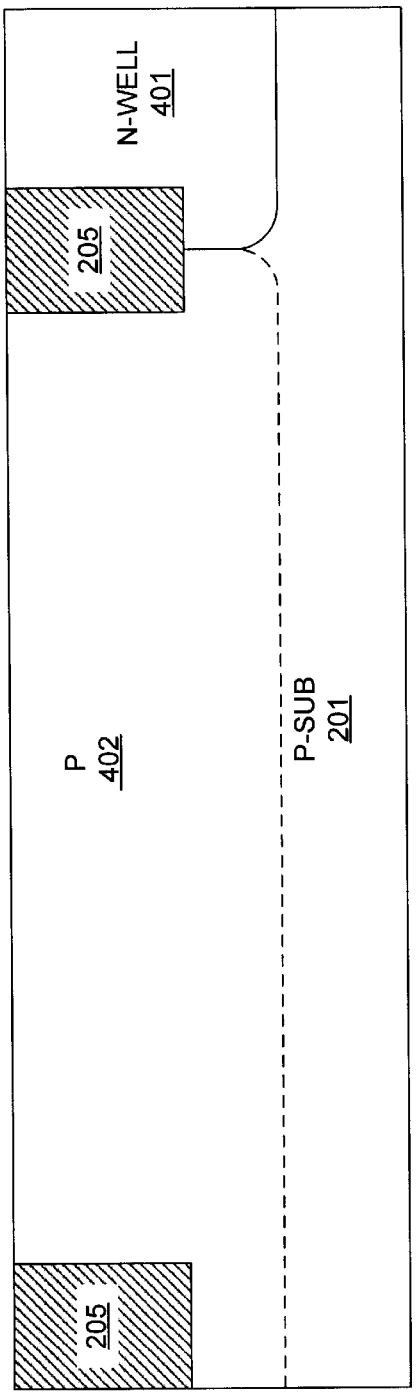
FIGS. 4A–4D are cross sectional views illustrating the manner in which the 1T/FB DRAM cell of FIG. 2 can be fabricated in a manner compatible with a bulk CMOS process.

As illustrated in FIG. 4A, an n-type well region 401 is formed in a p-type monocrystalline silicon substrate 201. N-well 401 is formed in accordance with conventional CMOS processing steps. For example, N-well 401 can be fabricated by ion implantation. Various crystal orientations and concentrations can be used in various embodiments of the invention. In addition, the conductivity types of the various regions can be reversed in other embodiments with similar results.

In the described embodiment, STI regions 205 are formed using shallow trench isolation (STI) techniques. In STI techniques, trenches are etched in silicon substrate 201, and these trenches are then filled with silicon oxide. The upper surface of the resulting structure is then planarized, such that the upper surfaces of STI regions 205 are substantially co-planar with the upper surface of substrate 201. In the described, STI regions 205 have a depth of about 4000 Angstroms. It is understood that this depth is used for purposes of description, and is not intended to limit the invention to this particular depth. Substrate 201 includes p-type region 402 located between STI regions 205 as illustrated. P-type region 402 can be a region of substrate 201, or a conventional P-well region.

Figure 4B:
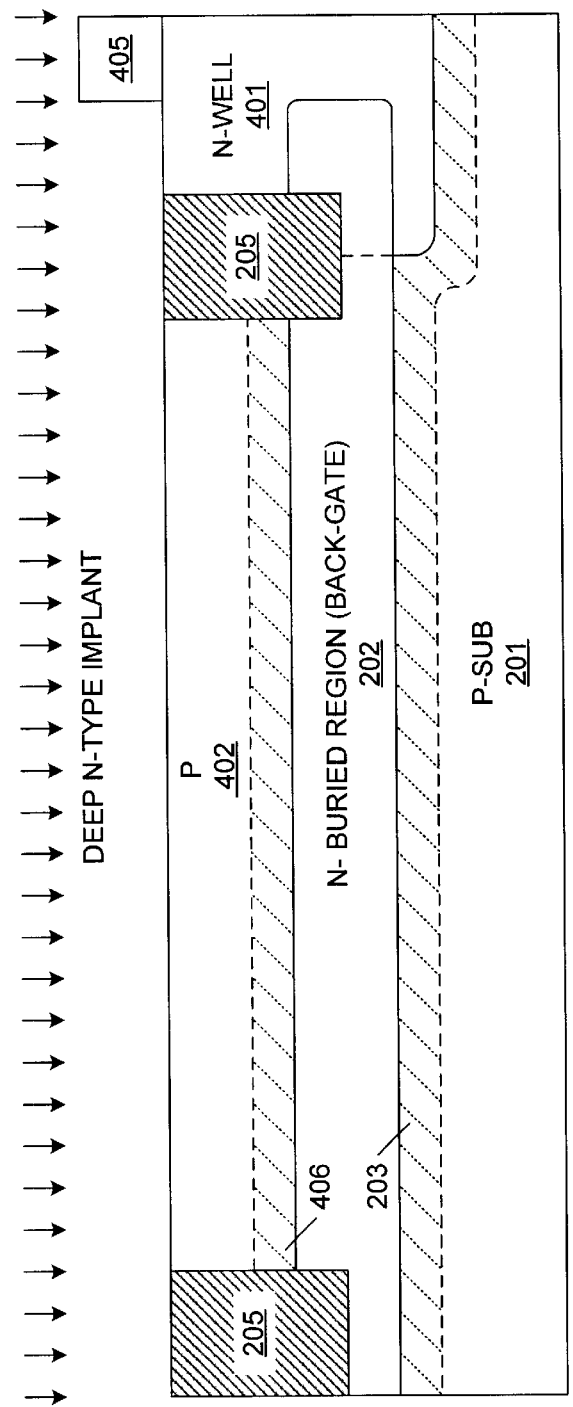

As illustrated in FIG. 4B, a photoresist mask 405 is formed over the upper surface of substrate 201 at locations where 1T/FB DRAM cells are not to be formed. For example, photoresist mask 405 is formed over locations (not shown) where conventional CMOS transistors are to be formed in substrate 201. Such conventional CMOS transistors can include transistors used for controlling the accessing of the 1T/FB DRAM cells.

A high-energy n-type ion implantation is performed through photoresist mask 405 into the cell array area to form n-type buried region 202 (FIG. 4B). In the described example, n-type buried region 202 extends into N-well region 401. The depth of n-type buried region 202 is chosen so that the bottom interface of this region 202 is below the depth of STI regions 205, and the top interface of this region 202 is at or above the depth of STI regions 205 and below the depth of the subsequently formed source and drain junctions 211–212. In the described embodiment, the bottom interface of region 202 is located about 6000 to 8000 Angstroms below the upper surface of substrate 201, and the top interface of region 202 is located about 3000 to 4000 Angstroms below the upper surface of substrate 201. Thus, the bottom interface of region 202 is about 2000 to 4000 Angstroms below the depth of STI regions 205, and the top interface of region 202 is about 0 to 1000 Angstroms above the depth of STI regions 205. In an alternate embodiment, the top interface of buried region 202 can be located below the depth of STI regions 205, as long as the associated depletion region 204 is located above the depth of STI regions 205.

The formation of n-type buried region 202 results in the presence of adjacent depletion regions 203 and 406, as illustrated. (Note that the formation of N-well 401 also contributes to the presence of depletion region 203.)

After n-type buried region 202 has been implanted, an additional ion implantation step can be performed through photoresist mask 405 to adjust the threshold voltage of DRAM cell 200, without introducing additional process complexity or cost.

Figure 4C:
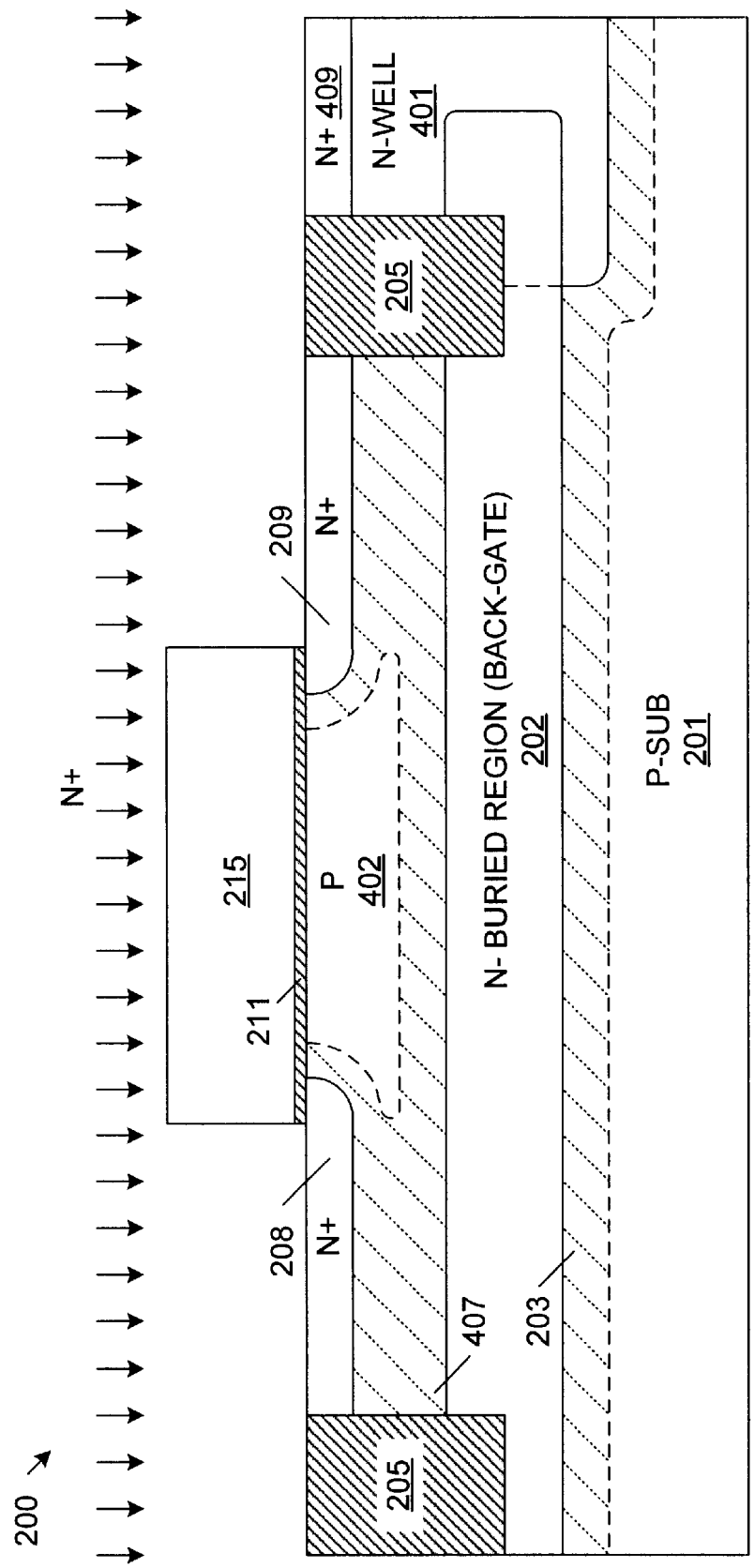
Figure 4D:
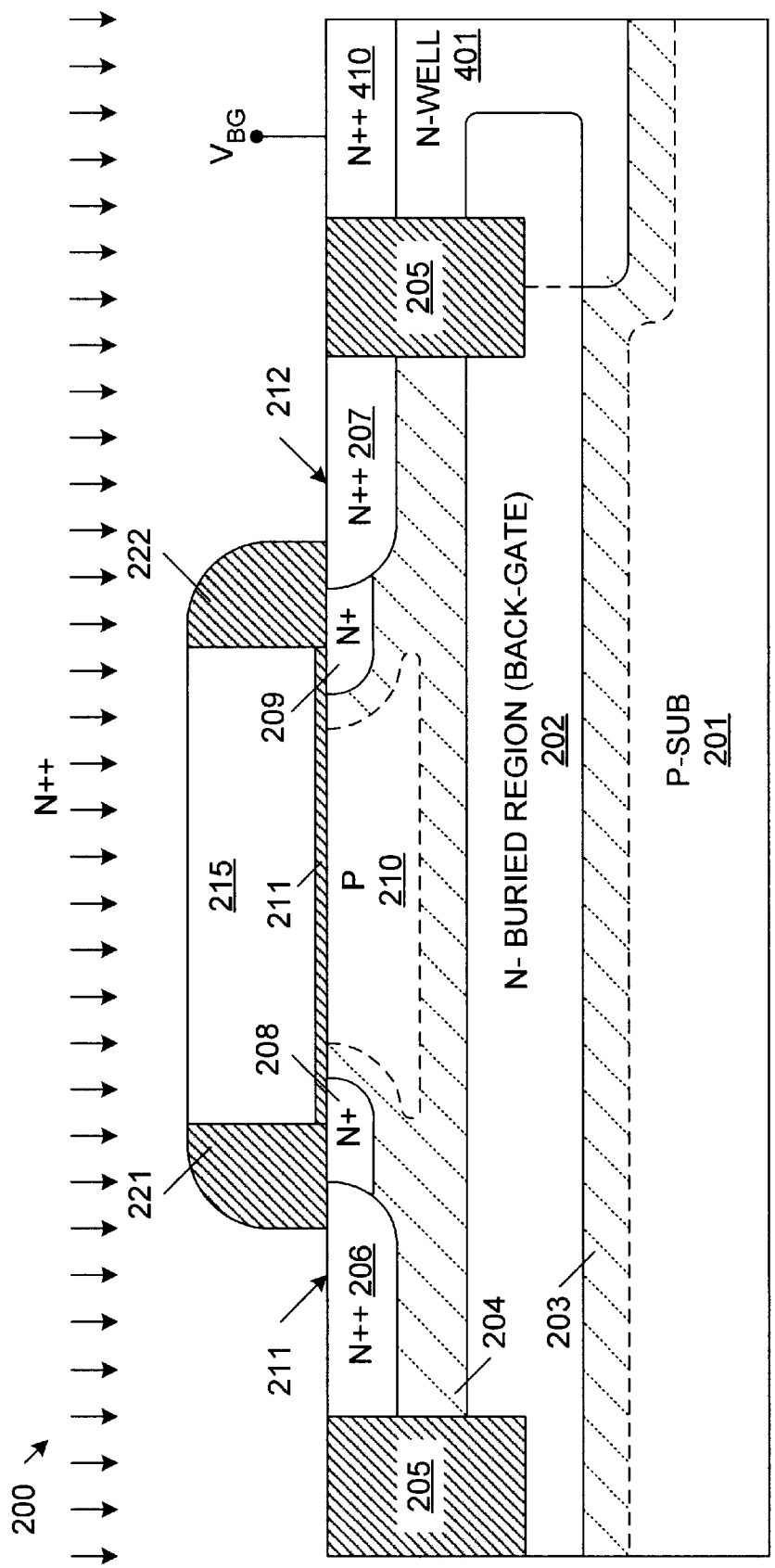

The process steps illustrated in FIGS. 4C–4D are conventional CMOS processing steps. As illustrated in FIG. 4C, gate dielectric layer 211 is formed over the upper surface of the resulting structure. In the described embodiment, gate dielectric layer 211 has an equivalent silicon oxide thickness in the range of about 2 to 4 nm. However, this thickness can vary depending on the process being used.

A layer of gate material, such as polycrystalline silicon, is deposited over the resulting structure. This layer of gate material is then patterned to form gate electrode 215. An N+ implant mask (not shown) is then formed to define the locations of the desired N+ LDD regions on the chip. An N+ implant step is then performed through the N+ implant mask. The implantation is self-aligned with the edges of polysilicon gate electrode 215. The N+ implant step forms N+ source region 208, N+ drain region 209 and N+ contact region 409. Note that N+ source and drain regions 208–209 result in an adjacent depletion region. The depletion region between N+ source and drain regions 208–209 and N− buried region 202 is labeled as element 407 in FIG. 4C.

As illustrated in FIG. 4D, dielectric sidewall spacers 221–222 are formed adjacent to gate electrode 215 using conventional processing steps. For example, sidewall spacers 221–222 can be formed by depositing one or more layers of silicon oxide and/or silicon nitride over the resulting structure and then performing an anistotropic etch-back step.

After sidewall spacers 221–222 have been formed, an N++ photoresist mask (not shown) is formed to define the locations of the desired N++ regions on the chip. An N++ type ion implant is then performed, thereby forming N++ source region 206, N++ drain region 207 and N++ contact region 410. N++ source and drain regions 206–207 are aligned with the edges of sidewall spacers 221–222, respectively.

Note that the formation of N++ source and drain regions 206–207 result in the formation of source and drain regions 211–212 and depletion region 204. P-type floating body region 210 remains in substrate 201 as illustrated in FIG. 4D. The back-gate bias voltage VBG is applied to buried back-gate region 202 via N++ contact region 410 and N-well 401.

Figure 5:
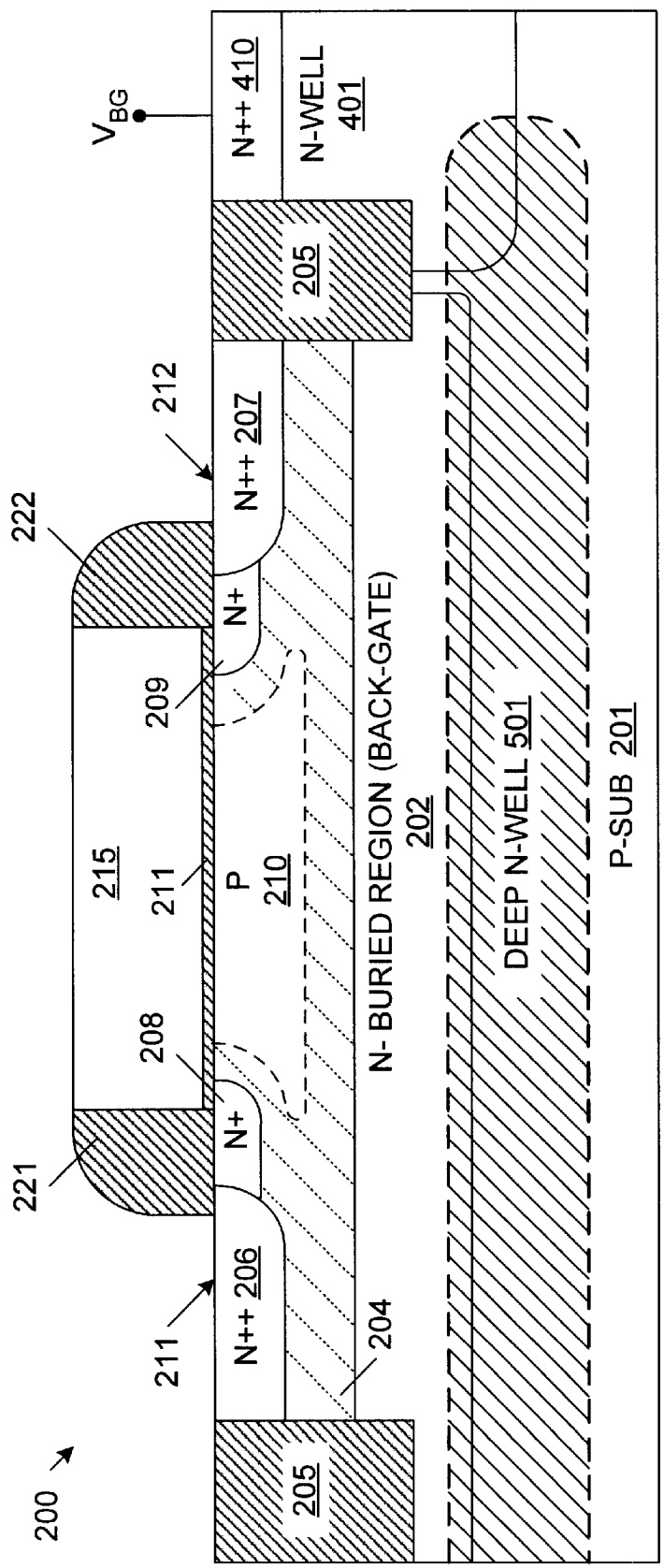
FIG. 5 is a cross-sectional view of a 1T/FB DRAM cell fabricated in a manner compatible with a triple-well CMOS process, in accordance with another embodiment of the present invention.

In an alternate embodiment, a process compatible with a conventional triple-well CMOS process is used to fabricate 1T/FB DRAM cell 200. FIG. 5 illustrates a triple-well embodiment, wherein similar elements in FIGS. 4D and 5 are labeled with similar reference numbers. FIG. 5 shows a deep N-well region 501, which is formed beneath buried back-gate region 202. DRAM cell 200 is formed inside a P-well above the deep N-well region 501. Buried back-gate region 202 is formed so that the bottom interface of this region 202 is in contact with deep N-well region 501, and the top interface of region 202 is above the depth of STI regions 205.

Figure 6:
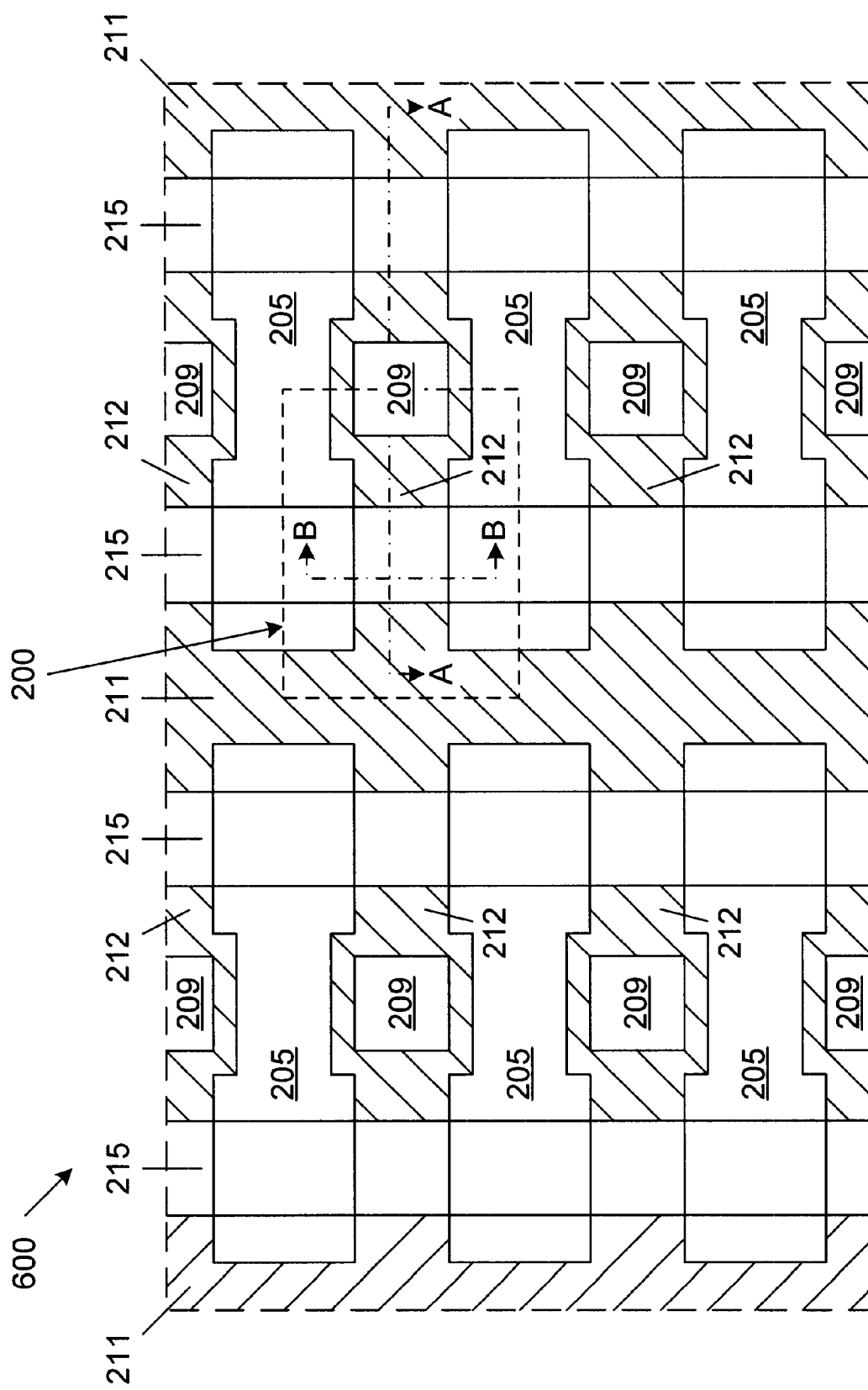
FIG. 6 is a layout diagram of a repeatable array of 1T/FB DRAM cells, including the 1T/FB DRAM cell of FIG. 2, in accordance with one embodiment of the present invention.
Figure 7A:
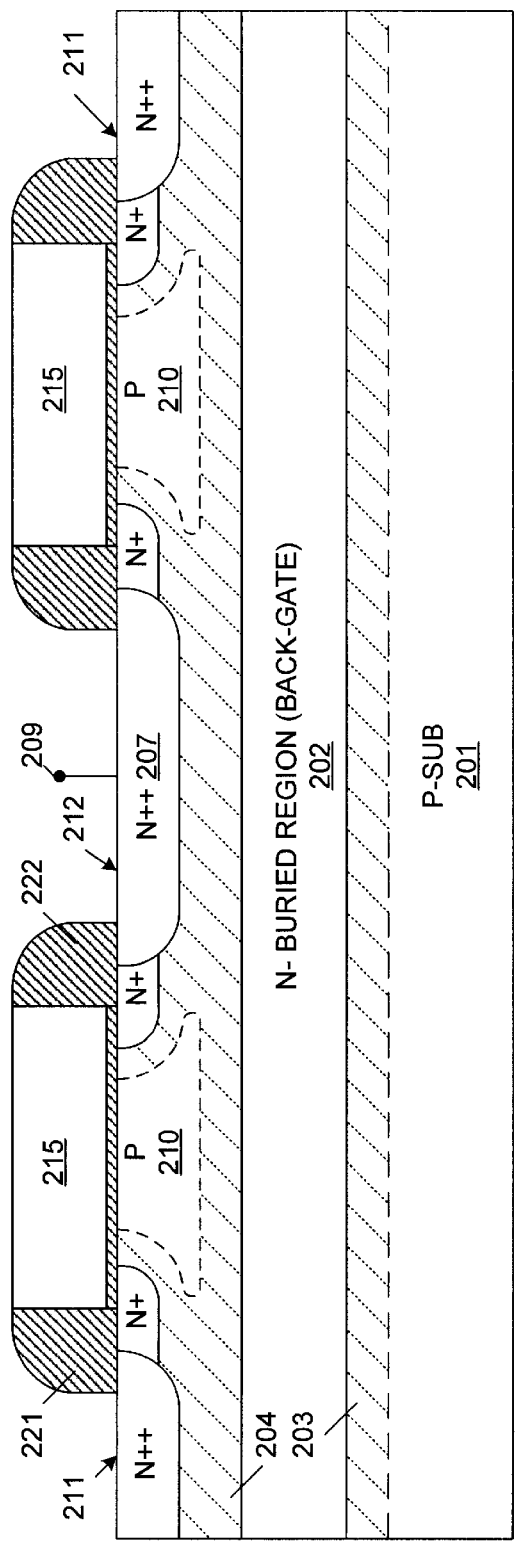
FIG. 7A is a cross-sectional view of a 1T/FB DRAM cell along section line A—A of FIG. 6.
Figure 7B:
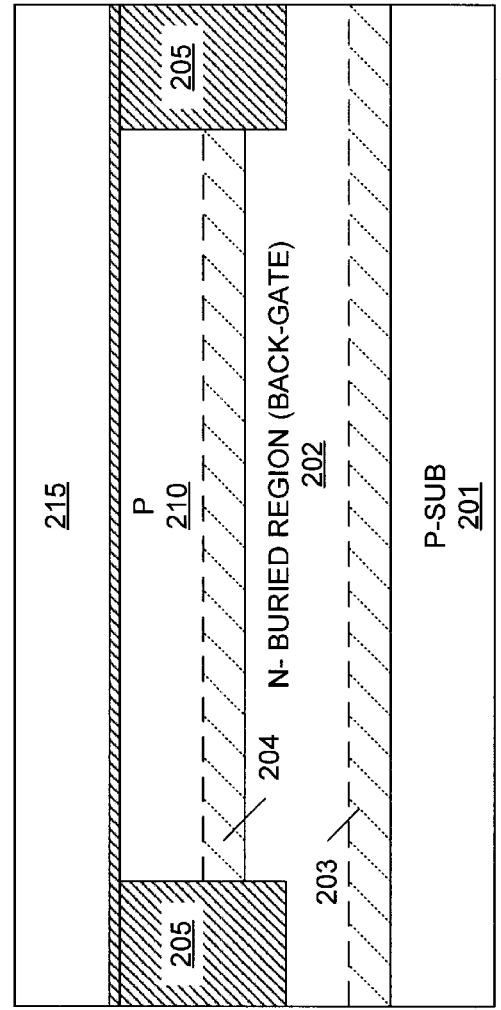
FIG. 7B is a cross-sectional view of a 1T/FB DRAM cell along section line B—B of FIG. 6.

FIG. 6 is a layout diagram of a repeatable array 600 of 1T/FB DRAM cells, including 1T/FB DRAM cell 200. FIG. 7A is a cross-sectional view of DRAM cell 200 along section line A—A of FIG. 6. FIG. 7B is a cross-sectional view of DRAM cell 200 along section line B—B of FIG. 6. Similar elements in FIGS. 2, 6, 7A and 7B are labeled with similar reference numbers. Thus, the reference number 215 is used to identify gate electrodes in FIGS. 2, 6, 7A and 7B. Note that drain contacts 209 are illustrated in FIGS. 6 and 7A.

As illustrated in FIGS. 6 and 7A, drain regions of adjacent DRAM cells are formed as continuous regions. A single drain contact 209 is used to provide connections to adjacent drain regions in array 600, advantageously reducing the required layout area of array 600. By biasing buried back-gate region 202 in the manner described above, depletion region 204 provides adequate isolation between the adjacent DRAM cells sharing the same drain region 212. Because STI regions are not required between these adjacent DRAM cells, the layout area of the array 600 can be made relatively small.

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A one-transistor, floating-body (1T/FB) dynamic random access memory (DRAM) cell comprising:
   a field-effect transistor having a source region and a drain region of a first conductivity type and a floating body region of a second conductivity type, opposite the first conductivity type, located between the source region and the drain region;
   a buried region of the first conductivity type located under the source region, drain region and floating body region; and
   a depletion region located between the buried region and the source region, the drain region and the floating body region, wherein the depletion region provides the sole lateral isolation for portions of the floating body region.

2. The 1T/FB DRAM cell of claim 1, further comprising a bias voltage source coupled to the buried region.

3. The 1T/FB DRAM cell of claim 1, wherein the first conductivity type is N-type, and the second conductivity type is P-type.

4. The 1T/FB DRAM cell of claim 3, further comprising a bias voltage source coupled to the buried region, wherein the bias voltage source provides a nominal voltage between –0.5 Volt and a $V_{CC}$ supply voltage.

5. The 1T/FB DRAM cell of claim 1, wherein the first conductivity type is P-type, and the second conductivity type is N-type.

6. The 1T/FB DRAM cell of claim 5, further comprising a bias voltage source coupled to the buried region, wherein the bias voltage source provides a nominal voltage between 0 Volts and a $V_{CC}$ supply voltage plus 0.5 Volts.

7. The 1T/FB DRAM cell of claim 1, wherein the buried region is grounded.

8. The 1T/FB DRAM cell of claim 1, wherein the buried region is floating.

9. The 1T/FB DRAM cell of claim 1, further comprising one or more shallow trench isolation (STI) regions, each having a bottom surface, the one or more STI regions being located adjacent to the source region and the drain region, wherein a top interface of the buried region is located at or above the bottom surface of the one or more STI regions and below the source region and the drain region.

10. The 1T/FB DRAM cell of claim 9, wherein a bottom interface of the buried region is located below the bottom surface of the one or more STI regions.

11. The 1T/FB DRAM cell of claim 1, wherein the buried region is formed by ion implantation.

12. A one-transistor, floating-body (1T/FB) dynamic random access memory (DRAM) cell comprising:
   a field-effect transistor having a source region and a drain region of a first conductivity type and a floating body region of a second conductivity type, opposite the first conductivity type, located between the source region and the drain region;
   a buried region of the first conductivity type located under the source region, drain region and floating body region;
   a depletion region located between the buried region and the source region, the drain region and the floating body region; and
   a deep well region of the first conductivity type located below and continuous with the buried region.

13. A one-transistor, floating-body (1T/FB) dynamic random access memory (DRAM) cell comprising:
   a field-effect transistor having a source region and a drain region of a first conductivity type and a floating body region of a second conductivity type, opposite the first conductivity type, located between the source region and the drain region;
   a buried region of the first conductivity type located under the source region, drain region and floating body region;
   a depletion region located between the buried region and the source region, the drain region and the floating body region; and
   a well region of the first conductivity type continuous with the buried region.

14. An array of one-transistor, floating-body (1T/FB) dynamic random access memory (DRAM) cells comprising:
   a first field-effect transistor having a first source region and a first drain region of a first conductivity type and a first floating body region of a second conductivity type, opposite the first conductivity type, located between the first source region and the first drain region;

a second field-effect transistor having a second source region and a second drain region of the first conductivity type, wherein the first drain region is continuous with the first drain region, and a second floating body region of the second conductivity type, located between the second source region and the second drain region;

a buried region of the first conductivity type located under the first and second source regions, the first and second drain regions and the first and second floating body regions; and a depletion region located between the buried region and the first and second source regions, the first and second drain regions and the first and second floating body regions, wherein the depletion region provides the sole lateral isolation between the first and second floating body regions.

15. The array of claim 14, further comprising a single contact providing a connection to the first and second drain regions.

* * * * *